US012672236B2

(12) United States Patent
Lee

(10) Patent No.: US 12,672,236 B2
(45) Date of Patent: Jun. 30, 2026

(54) COMPONENT CARRIER WITH PROTRUDING PORTIONS AND MANUFACTURING METHOD

(71) Applicant: AT&S Austria Technologie & Systemtechnik AG, Leoben (AT)

(72) Inventor: Minwoo Lee, Chongqing (CN)

(73) Assignee: AT&S Austria Technologie & Systemtechnik Aktiengesellschaft, Leoben (AT)

( * ) Notice: Subject to any disclaimer, the term of this patent is extended or adjusted under 35 U.S.C. 154(b) by 671 days.

(21) Appl. No.: 18/156,736

(22) Filed: Jan. 19, 2023

(65) Prior Publication Data

US 2023/0262892 A1 Aug. 17, 2023

(30) Foreign Application Priority Data

Jan. 21, 2022 (CN) .......................... 202210072285.4

(51) Int. Cl.
*H05K 1/11* (2006.01)
*H05K 1/02* (2006.01)
*H05K 3/46* (2006.01)

(52) U.S. Cl.
CPC ........... *H05K 1/115* (2013.01); *H05K 1/0298* (2013.01); *H05K 3/4682* (2013.01); *H05K 2201/096* (2013.01); *H05K 2201/09827* (2013.01)

(58) Field of Classification Search
None
See application file for complete search history.

(56) References Cited

U.S. PATENT DOCUMENTS

| | | | |
|---|---|---|---|
| 8,555,494 B2 | 10/2013 | Jomaa | |
| 9,324,580 B2* | 4/2016 | Kung | ................... H01L 21/6835 |
| 2008/0149383 A1* | 6/2008 | Kaneko | ............. H01L 23/49827 |
| | | | 174/262 |
| 2010/0139969 A1 | 6/2010 | An et al. | |

(Continued)

FOREIGN PATENT DOCUMENTS

| | | |
|---|---|---|
| CN | 109729639 A | 5/2019 |
| EP | 2999318 B1 | 9/2020 |
| WO | 2012040743 A2 | 3/2012 |

OTHER PUBLICATIONS

First Office Action in Application No. 202210072285.4; pp. 1-8; Apr. 8, 2026; China National Intellectual Property Administration; No. 6 Xitucheng Road, ☐ Haidian Diatrict, Beijing, P.R.China, 100088.

(Continued)

*Primary Examiner* — Timothy J Thompson
*Assistant Examiner* — John B Freal
(74) *Attorney, Agent, or Firm* — Robert A. Blaha; Smith Tempel Blaha LLC

(57) ABSTRACT

A coreless component carrier includes a stack with at least two electrically conductive layer structures and at least one electrically insulating layer structure, vias that vertically interconnect the electrically conductive layer structures in the stack, and protruding portions that protrude from the outermost electrically conductive layer structure of the stack beyond the upper main surface of the stack. The vias include an electrically conductive material and taper in the same direction. Methods for manufacturing the coreless component carrier are also disclosed.

21 Claims, 5 Drawing Sheets

(56)     References Cited

U.S. PATENT DOCUMENTS

| | | | | | |
|---|---|---|---|---|---|
| 2010/0263923 | A1* | 10/2010 | Kodani | ............ | H01L 23/49811 |
| | | | | | 29/846 |
| 2011/0228464 | A1 | 9/2011 | Guzek et al. | | |
| 2012/0222894 | A1* | 9/2012 | Kaneko | .................. | H05K 3/244 |
| | | | | | 216/13 |
| 2013/0140692 | A1* | 6/2013 | Kaneko | ............ | H01L 23/49866 |
| | | | | | 174/250 |
| 2013/0256012 | A1* | 10/2013 | Kodani | .................. | H05K 1/113 |
| | | | | | 174/262 |
| 2015/0156883 | A1* | 6/2015 | Bong | .................. | H05K 3/4007 |
| | | | | | 174/266 |
| 2015/0214171 | A1 | 7/2015 | Hurwitz et al. | | |
| 2016/0093583 | A1 | 3/2016 | Yu et al. | | |
| 2022/0104347 | A1* | 3/2022 | Park | .................... | H01L 23/5383 |
| 2022/0399261 | A1* | 12/2022 | Mok | .................. | H01L 21/4857 |
| 2023/0123522 | A1* | 4/2023 | Tanaka | ................. | H05K 3/4682 |
| | | | | | 174/262 |

OTHER PUBLICATIONS

English Translation of First Office Action in Application No.
202210072285.4; pp. 1-8; Apr. 8, 2026; China National Intellectual
Property Administration; No. 6 Xitucheng Road, ☐ Haidian Diatrict,
Beijing, P.R.China, 100088.

* cited by examiner

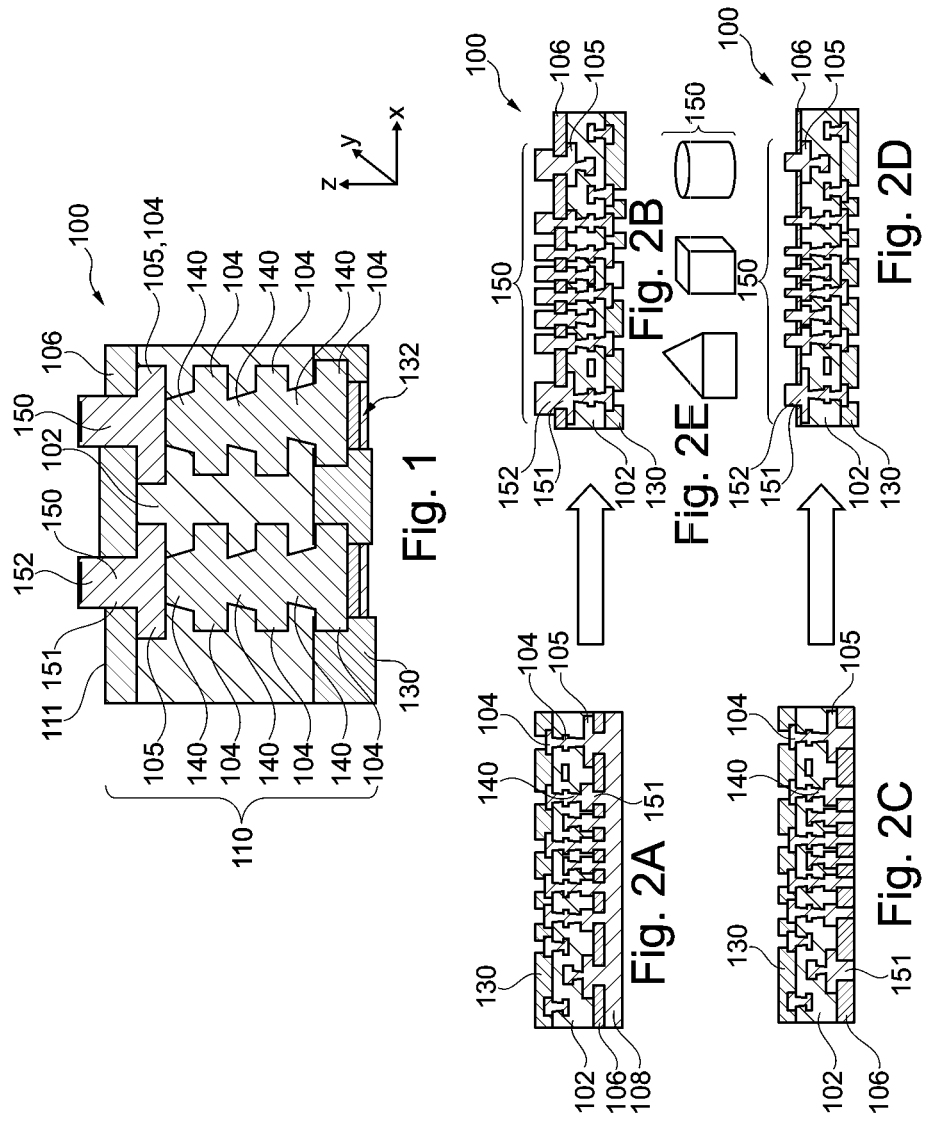

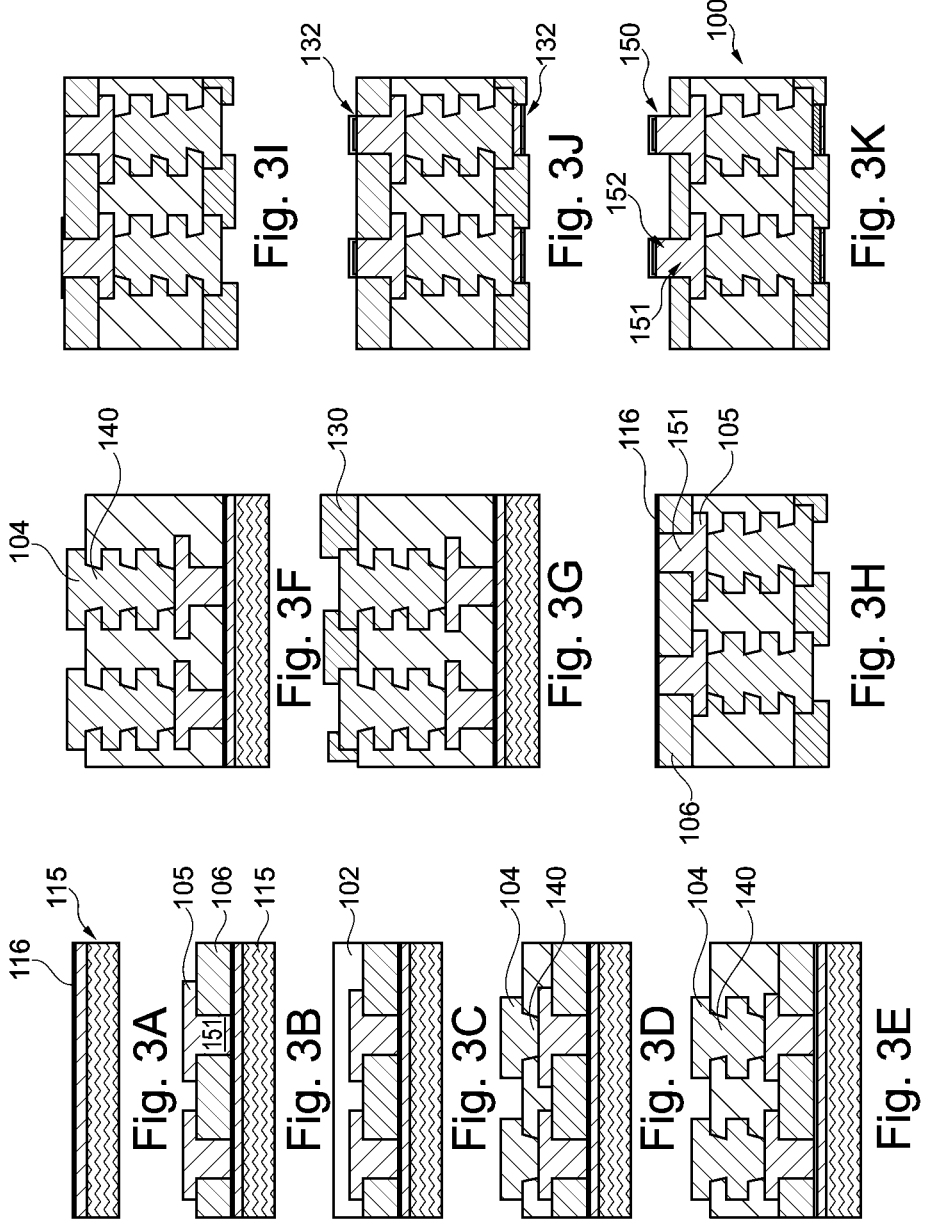

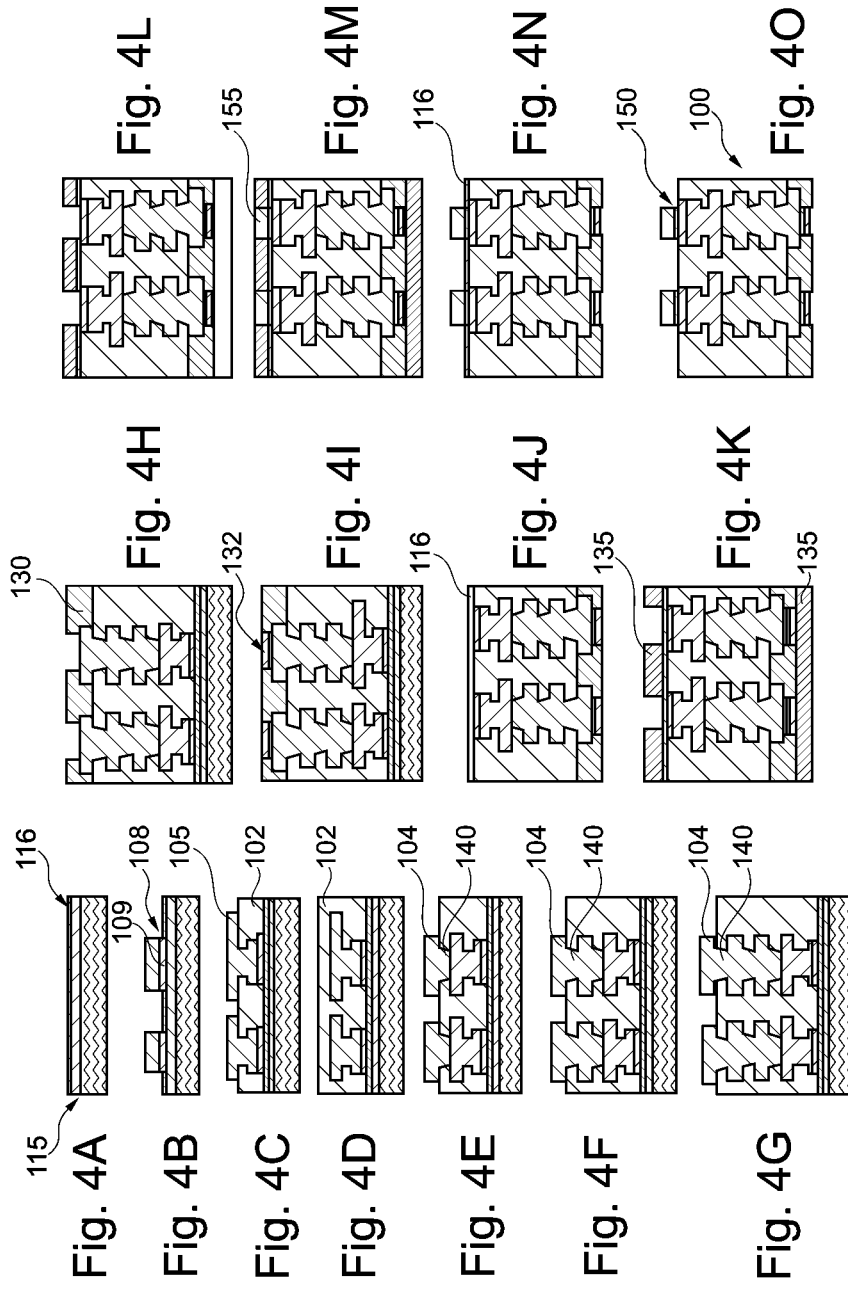

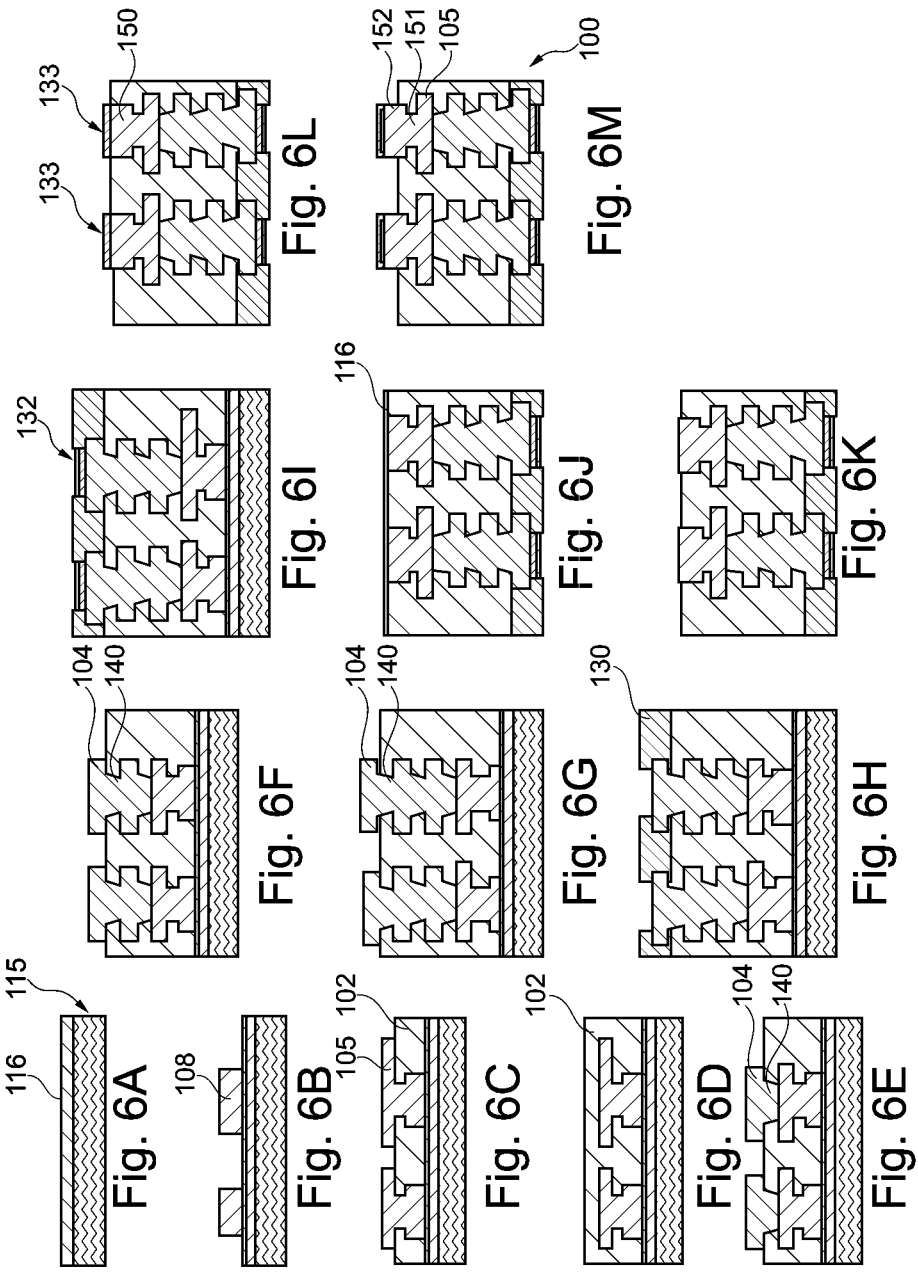

COMPONENT CARRIER WITH PROTRUDING PORTIONS AND MANUFACTURING METHOD

CROSS-REFERENCE TO RELATED APPLICATIONS

This application claims the benefit of the filing date of Chinese Patent Application No. 202210072285.4 filed Jan. 21, 2022, the disclosure of which is hereby incorporated herein by reference.

TECHNICAL FIELD

Embodiments disclosed herein relate to a component carrier and a method of manufacturing a component carrier.

BACKGROUND ART

In the context of growing product functionalities of component carriers equipped with one or more electronic components and increasing miniaturization of such electronic components as well as a rising number of electronic components to be mounted on the component carriers such as printed circuit boards, increasingly more powerful array-like components or packages having several electronic components are being employed, which have a plurality of contacts or connections, with ever smaller spacing between these contacts. Removal of heat generated by such electronic components and the component carrier itself during operation becomes an increasing issue. Also, an efficient protection against electromagnetic interference (EMI) becomes an increasing issue. At the same time, component carriers shall be mechanically robust and electrically reliable so as to be operable even under harsh conditions.

In particular, providing protruding structures, such as pillars or bumps, for a multi-layer component carrier, in particular a coreless component carrier, in an accurate manner, may be considered a challenge.

SUMMARY

There may be a need to provide a coreless multi-layer component carrier with protruding portions in an efficient and robust manner.

A component carrier and a manufacturing method are provided.

According to an aspect of the disclosure, there is described a component carrier, being a coreless (i.e., comprising no cured core material or metal core) component carrier. The coreless component carrier includes i) a stack with at least two electrically conductive layer structures and at least one electrically insulating layer structure, ii) a plurality of vias that vertically (essentially along the z-axis) interconnect the (stacked) electrically conductive layer structures in the stack (through electrically insulating material), iia) wherein the vias comprise an electrically conductive material (e.g., copper), iib) wherein the vias are tapering vias (in particular laser vias), and iic) wherein the vias taper (essentially) in the same direction (e.g., towards the upper main surface of the stack), and iii) a plurality of protruding portions (e.g., protruding bumps) (in particular with (essentially) straight sidewalls), that protrude from the outermost electrically conductive layer structure of the stack beyond the upper main surface of the stack.

According to a further aspect of the disclosure, there is described a method of manufacturing a coreless component carrier (e.g., as described above), the method includes i) forming a stack with at least two electrically conductive layer structures and at least one electrically insulating layer structure, ii) forming (in particular by laser drilling) a plurality of vias that vertically interconnect the electrically conductive layer structures in the stack, and forming (e.g., by copper plating) the plurality of vias with an electrically conductive material, so that the vias are tapering vias, and taper in the same direction, and iii) forming (in particular exposing) a plurality of protruding portions that protrude from the outermost electrically conductive layer structure of the stack beyond the upper main surface of the stack.

OVERVIEW OF EMBODIMENTS

In the context of the present document, the term "component carrier" may particularly denote any support structure which is capable of accommodating one or more components thereon and/or therein for providing mechanical support and/or electrical connectivity. In other words, a component carrier may be configured as a mechanical and/or electronic carrier for components. In particular, a component carrier may be one of a printed circuit board, an organic interposer, a metal core substrate, an inorganic substrate and an IC (integrated circuit) substrate. A component carrier may also be a hybrid board combining different ones of the above-mentioned types of component carriers. The term "component carrier preform" may refer to a semi-finished product that will result, after several process steps, in a final component carrier. A preform may, e.g., be a panel that comprises a plurality of (semi-finished) component carriers that will be separated in a further manufacturing step.

In the context of the present document, the term "protruding portion" may particularly denote any structure that at least partially extends beyond the main surface of the stack. The stack main surface may be the outer main surface of the outermost stack layer. The protruding portion may be arranged partially in the stack and partially out of the stack. In an example, a first portion of the protruding portion is embedded in a layer of the stack, e.g., an electrically insulating layer structure, while a second portion of the protruding portion may be (completely) exposed. A protruding portion may be formed by (wet) etching a metal layer. Further, a protruding portion may be formed by filling a hole in an electrically insulating layer with metal and, afterwards, at least partially removing material from the insulating layer, e.g., by plasma etching.

In the context of the present document, the term "stack" may particularly refer to a plurality of layer structures that are stacked in a vertical direction (z) one above the other. The stack may be formed as a plate with two horizontal directions of main extension (x, y). The stacking direction may be perpendicular to these directions of main extension. The stack may comprise one electrically insulating layer structure, in which a plurality of electrically conductive layer structures is embedded, or a plurality of one electrically insulating layer structures. In an example, electrically insulating layer structures and electrically conductive layer structures are stacked in an alternating manner.

According to an exemplary embodiment, the disclosure may be based on the idea that a component carrier, being a coreless multi-layer component carrier, with protruding portions can be provided in an efficient and robust manner, when the protruding portions extend from a stack that comprises a plurality of filled vias that taper in the same direction and vertically interconnect the electrically conductive layer structures in the stack. This configuration reflects the manufacturing method of forming a multi-layer build-up (step-by-step) and then exposing the protruding portion at the outermost surface of the stack. Even though a thin (coreless) substrate is applied, the plurality of electrically conductive layers, interconnected by the filled vias, stabilize the structure and enable a solid base for the protruding portions.

Conventionally, copper bumps are provided on a (core-stabilized) circuit board by plating. These bumps are then grinded to obtain protruding structures of a specific height. However, this approach may not lead to accurate results based on variances during (copper) plating, lithography, and grinding quality. Hereby, process (and process machine) costs may be significant.

In contrast, the approach described here may enable a thin but robust substrate with protruding portions of accurate heights (low C4 pad height difference). Hereby, the formation of protruding portions is done within the same process as the layer build-up, for example by etching steps. In contrast to conventional approaches, the protrusions are not previously formed and then adapted (by grinding) but are directly formed in their desired height and are then exposed, e.g., by etching a metal layer or an insulating layer in which the protrusions are embedded. Levelling (height adjustment of protruding structures) is thereby not depending on variances during lithography, plating, and (mechanical) grinding and issues of the prior art may be overcome. The accurate protrusion height may improve reliability in signal transmission and component carrier interconnections.

According to an embodiment, the plurality of protruding portions extends in a vertical direction (z) with respect to the layer stack. In other words, the protruding portions extend in a direction perpendicular to the directions of main extension (x, y) (which are along the horizontal direction) of the stack/component carrier. In an example, the protrusions form a (essentially) right angle with the main surface of the stack.

This configuration may provide the advantage that the protrusions can be applied to establish a connection to an electronic component, an interposer, or a further component carrier (e.g., a component carrier z-connection). Since the protruding portions are accurate, in particular of similar height, even highly precise (high density) applications may be enabled.

According to a further embodiment, at least one protruding portion from the plurality of protruding portions comprises (substantially) straight sidewalls. According to a further embodiment, at least one protruding portion from the plurality of protruding portions does (substantially) not taper. In comparison to the vias (that have tapering sidewalls), the protruding portions may essentially not taper. This configuration may reflect the manufacturing process of (wet/plasma) etching (or mechanical drilling) which processes lead to straight sidewalls. Forming laser vias, in contrast, may lead to higher tapering sidewalls. In an example, sidewalls formed by etching or lithography may not be fully straight or may taper slightly (e.g., 90%), but not to the extent as in case of laser-drilled vias.

According to a further embodiment, at least one protruding portion from the plurality of protruding portions comprises not straight sidewalls and/or tapers.

According to a further embodiment, at least one protruding portion from the plurality of protruding portions comprises a cross-sectional shape of the group which consists of: circular, rectangular, polygonal, triangular, conical, frusto-conical. In a specific embodiment, at least one protruding portion comprises a base plate with a cone-shape on top.

This may provide the advantage that a plurality of different designs is enabled that may be adjusted to the desired application.

According to a further embodiment, the protruding part of at least one protruding portion (with respect to the external surface of the outermost electrically conductive layer structure of the stack) monolithically merges from the part of the protruding portion passing through the outermost electrically conductive layer structure of the stack.

According to a further embodiment, at least one protruding portion is monolithically provided with a base configured to have a cut off in the internal side of the outermost electrically conductive layer structure (the base cross section may be larger than the cross section of the rest of the protruding portion (e.g., a cone-shape) and/or has a different shape).

According to a further embodiment, the cross section of at least one protruding portion at the external surface of the outermost electrically conductive layer structure of the stack is constant along the axial extension of the protruding part.

According to a further embodiment, the cross section of at least one protruding portion at the external surface of the outermost electrically conductive layer structure of the stack decreases along the axial extension of the protruding part.

Advantages may be related to the same level of the outer surfaces of the protrusions due to the realization of the protrusions (as described above) before the formation of the last layer.

According to a further embodiment, the plurality of vias taper towards the plurality of protruding portions. This configuration may reflect a manufacturing method, wherein the protruding portion (or a preform thereof) is formed first and then, the vias are formed (by drilling (mechanical, laser drilling), plasma etching, lithography exposure, etc.) above the protruding portion (preform) during a layer build-up. Turning the component carrier around yields the protruding portions at the upper main surface and the vias tapering towards the protruding portion. In this manner, the protruding portions may be efficiently and robustly electrically connected by the vias.

According to a further embodiment, the plurality of vias taper away from the plurality of protruding portions (in the opposite direction). For example, such an opposite tapering direction may be provided, if a photo imageable dielectric (PID) material is used (instead normal resins). Lithography exposure may provide a very strong electromagnetic radiation energy through a glass mask down to the bottom of the PID material (film), and the electromagnetic radiation energy may be reflected and scattered to the sides from the bottom. As a result, the bottom diameter may be larger than the top diameter.

According to a further embodiment, the at least one electrically insulating layer structure comprises a PID material. Thereby, forming vias/protruding portion may be done using photolithography.

According to a further embodiment, at least one of the electrically conductive layer structures comprises a vertically extending portion with straight sidewalls, wherein the vertically extending portion is at least partially embedded in the stack. In an embodiment, at least some vias may not be tapering (e.g., manufactured by mechanical drilling, special kinds of laser drilling, or etching) and have straight sidewalls. This may enhance design flexibility. In another example, the protruding portion(s) may be directly coupled (connected or integrally formed) with respective (not tapering) vias. This measure may enhance stability.

According to a further embodiment, at least one of the electrically conductive layer structures is configured as a discontinuous layer, in particular a patterned metal layer. While in an example, at least one of the electrically conductive layer structures is configured as a continuous layer (electrically conductive layer), at least one of the electrically conductive layer structures may be configured as a discontinuous layer (electrically conductive (layer) structure). In particular, the discontinuous layer structure may be patterned. For example, each portion of the pattern may be electrically connected from above and from below by a via. A plurality of such pattern portions may be electrically connected in the vertical direction to form a vertical through-connection to a protruding portion. A plurality of such vertical through connections may be established in the layer stack (e.g., in parallel with respect to each other).

According to a further embodiment, at least one protruding portion from the plurality of protruding portions comprises solder bumps. This may provide the advantage that the protruding portions can be used as efficient and robust electric connectors, e.g., for an interposer or an electric component. The solder bumps may be arranged on top of a plurality of protruding portion preforms, respectively. The skilled person may know a variety of different suitable solder materials.

According to a further embodiment, the at least two electrically conductive layer structures is embedded in the at least one electrically insulating layer structure. In this configuration, electrically insulating material may form a continuous layer structure that encapsulates the conductive layer structures, in particular patterned layer structures. The electrically insulating layer structure may comprise a plurality of electrically insulating layer structures (essentially) of the same material and/or properties. Even though the term "the electrically insulating layer structure" is used, such a structure may comprise a plurality of sub-layer structures.

According to a further embodiment, the at least one electrically insulating layer structure partially embeds the plurality of protruding portions. The protruding portions may be coupled to the electrically conductive layer structures and, at a lower portion, be embedded by insulating material. The last may serve as an additional protection and, at the same time, insulation between the protruding portions. Further, the insulating material may reflect a manufacturing step of partially removing an insulating layer structure.

According to a further embodiment, the component carrier further comprises a further electrically insulating layer structure that partially embeds the plurality of protruding portions. Such a further electrically insulating layer structure may comprise the same material/properties as the electrically insulating layer structure(s) or may comprise different material/properties. In an example, the further electrically insulating layer structure comprises ABF® (Ajinomoto-build-up film®) or PID (polyimide) material. ABF and Ajinomoto-build-up film are registered marks of the Ajinomoto Co. Inc., of Tokyo, Japan. The material of the further electrically insulating layer structure may be suitable to be partially removed by (plasma) etching. The further electrically insulating layer structure may serve as an additional protection and, at the same time, insulation between the protruding portions. Further, the insulating material may reflect a manufacturing step of partially removing the further insulating layer structure.

According to a further embodiment of the method, forming the plurality of protruding portions comprises at least partially exposing the plurality of protruding portions. This may provide the advantage that the protruding portions can be produced in-line with the component carrier (build-up) manufacturing process. There may be provided an electrically insulating layer structure or an electrically conductive layer structure and the protruding portions may be cut out, e.g., by etching.

According to a further embodiment of the method, exposing comprises removing electrically insulating material of the at least one (further) electrically insulating layer structure.

According to a further embodiment of the method, removing comprises at least partially removing the electrically insulating material by plasma etching. Thereby, the protruding portions may be formed in an accurate manner using an established industry process.

The term "plasma etch" may refer to a process of processing a component carrier preform using a plasma. Plasma etching may comprise a high-speed stream of glow discharge (plasma) of an appropriate gas mixture being applied (in pulses) to the component carrier preform. The plasma, here the etch species, may be charged (ions) or neutral (atoms and radicals). During the etch process, the plasma may generate volatile etch products from the chemical reactions between the elements of the etched material and the reactive species generated by the plasma. The plasma etch may remove only insulating material or film material and metal material.

According to a further embodiment of the method, the electrically insulating material comprises a film, in particular a photoresist. This measure may enable specific manufacturing schemes. Such a film may be suitable to be accurately removed by (plasma) etching.

According to a further embodiment of the method, exposing comprises removing electrically conductive material of the outermost electrically conductive layer structure. Thereby, the protruding portions may be formed in an accurate manner using an established industry process.

According to a further embodiment of the method, removing comprises at least partially removing the electrically conductive material by (wet or dry) etching.

The term "wet etch" may refer to an etching step in which a fluid (in particular a liquid) is applied. According to a specific example, etching may be done by using an etching solution from an etching bath. The etching solution may comprise copper (cupric) chloride ($CuCl_2$) and the etching reaction is as follows: $CuCl_2 + Cu \rightarrow 2\ CuCl$ (cuprous chloride). Hereby, copper chloride may be mixed with water and/or hydrochloric acid. Further, an additive such as HTB and/or an inhibitor (e.g., a polymer) may be used. In another example, iron (III) chloride may be used for etching as follows: $Cu + 2\ FeCl_3 \rightarrow CuCl_2 + 2\ FeCl_2$. In another example, copper nitrate and ammonium chloride may be used. In an embodiment, wet etching may be isotropic etching. The term "dry etch" may refer to an etching step in which (essentially) no liquid is applied. Instead, an ion bombardment (e.g., a plasma of reactive gases such as oxygen or chlorine) may be applied to the component carrier preform. In an embodiment, dry etching may be anisotropic etching.

According to a further embodiment of the method, forming the plurality of protruding portions comprises forming a hole, in particular with (essentially) straight sidewalls (e.g., around 90%), in an electrically insulating material structure, in particular by at least one of drilling (mechanical or (excimer) laser), etching, litho-exposure, and filling the hole with electrically conductive material, in particular by plating. Preforms of the protruding portions may be formed at an early stage of the manufacturing process and the layer build-up (conductive layer structures and vias) may be formed on top. The layer stack may stabilize the protruding portions embedded (and protected) in insulating material. By (partially) removing the insulating material, the protruding portions may be exposed at a later process stage.

According to a further embodiment of the method, forming the plurality of protruding portions comprises forming a metal (in particular solder) bump, in particular by plating, on the outermost electrically conductive layer structure.

According to a further embodiment of the method, forming the plurality of protruding portions is free of grinding. Since the protruding portions may be formed during the (build-up) manufacturing process, they already have the desired height (shape). Fine-tuning by grinding may thus be omitted, variances may thus be avoided and the accuracy may be improved.

According to a further embodiment of the method, forming the plurality of vias comprises forming tapering holes by laser drilling. Thus, the vias may be efficiently formed using established PCB-manufacturing technology.

According to a further embodiment of the method, the plurality of protruding portions is formed before the plurality of vias (see, e.g., FIG. 3). This may provide the advantage that the height and shape of the protruding portions may be controlled (and adjusted) accurately, while further layers can be arranged on top, thus stabilizing the coreless component carrier.

According to a further embodiment, the method further comprises at least partially forming the stack on a temporary carrier. The method may further comprise removing the temporary carrier before forming, in particular exposing, the plurality of protruding portions. The protruding portions may be formed (directly) on the temporary carrier (e.g., on a seed layer). This measure may protect the preforms of protruding portions (yet embedded) during the further build-up. Afterwards, the temporary carrier may be removed and the protruding portions may be exposed.

According to a further embodiment of the method, forming the stack comprises lamination. This may provide the advantage that the stack and (in the same process) the protruding portions can be manufactured using established PCB-manufacturing technology. The described method may hence directly be implemented into existing component carrier manufacturing processes.

In an embodiment, the component carrier comprises a stack of at least one electrically insulating layer structure and at least one electrically conductive layer structure. For example, the component carrier may be a laminate of the mentioned electrically insulating layer structure(s) and electrically conductive layer structure(s), in particular formed by applying mechanical pressure and/or thermal energy. The mentioned stack may provide a plate-shaped component carrier capable of providing a large mounting surface for further components and being nevertheless very thin and compact. The term "layer structure" may particularly denote a continuous layer, a patterned layer or a plurality of non-consecutive islands within a common plane.

In an embodiment, the component carrier is shaped as a plate. This contributes to the compact design, wherein the component carrier nevertheless provides a large basis for mounting components thereon. Furthermore, in particular a bare die as example for an embedded electronic component, can be conveniently embedded, thanks to its small thickness, into a thin plate such as a printed circuit board.

In an embodiment, the component carrier is configured as one of the group consisting of a printed circuit board, a substrate (in particular an IC substrate), and an interposer.

In the context of the present application, the term "printed circuit board" (PCB) may particularly denote a plate-shaped component carrier which is formed by laminating several electrically conductive layer structures with several electrically insulating layer structures, for instance by applying pressure and/or by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming holes through the laminate, for instance by laser drilling or mechanical drilling, and by partially or fully filling them with electrically conductive material (in particular copper), thereby forming vias or any other through-hole connections. The filled hole either connects the whole stack, (through-hole connections extending through several layers or the entire stack), or the filled hole connects at least two electrically conductive layers, called via. Similarly, optical interconnections can be formed through individual layers of the stack in order to receive an electro-optical circuit board (EOCB). Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of the present application, the term "substrate" may particularly denote a small component carrier. A substrate may be a, in relation to a PCB, comparably small component carrier onto which one or more components may be mounted and that may act as a connection medium between one or more chip(s) and a further PCB. For instance, a substrate may have substantially the same size as a component (in particular an electronic component) to be mounted thereon (for instance in case of a Chip Scale Package (CSP)). More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical, thermal and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing particles (such as reinforcing spheres, in particular glass spheres).

The substrate or interposer may comprise or consist of at least a layer of glass, silicon (Si) and/or a photoimageable or dry-etchable organic material like epoxy-based build-up material (such as epoxy-based build-up film) or polymer compounds (which may or may not include photo- and/or thermosensitive molecules) like polyimide or polybenzoxazole.

In an embodiment, the at least one electrically insulating layer structure (and/or the base substrate) comprises at least one of the group consisting of a resin or a polymer, such as epoxy resin, cyanate ester resin, benzocyclobutene resin, bismaleimide-triazine resin, polyphenylene derivate (e.g., based on polyphenylenether, PPE), polyimide (PI), polyamide (PA), liquid crystal polymer (LCP), polytetrafluoroethylene (PTFE) and/or a combination thereof. Reinforcing structures such as webs, fibers, spheres or other kinds of filler particles, for example made of glass (multilayer glass) in order to form a composite, could be used as well. A semi-cured resin in combination with a reinforcing agent, e.g., fibers impregnated with the above-mentioned resins is called prepreg. These prepregs are often named after their properties e.g., FR4 or FR5, which describe their flame retardant properties. Although prepreg particularly FR4 are usually preferred for rigid PCBs, other materials, in particular epoxy-based build-up materials (such as build-up films) or photoimageable dielectric (PID) materials, may be used as well. For high-frequency applications, high-frequency materials such as polytetrafluoroethylene, liquid crystal polymer and/or cyanate ester resins, may be preferred. Besides these polymers, low temperature cofired ceramics (LTCC) or other low, very low or ultra-low DK materials may be applied in the component carrier as electrically insulating structures.

In an embodiment, the at least one electrically conductive layer structure (and/or metal trace) comprises at least one of the group consisting of copper, aluminum, nickel, silver, gold, palladium, tungsten, magnesium, and titanium. Although copper is usually preferred, other materials or coated versions thereof are possible as well, in particular coated with supra-conductive material or conductive polymers, such as graphene or poly(3,4-ethylenedioxythiophene) (PEDOT), respectively.

At least one component may be embedded in the component carrier and/or may be surface mounted on the component carrier. Such a component can be selected from a group consisting of an electrically non-conductive inlay, an electrically conductive inlay (such as a metal inlay, preferably comprising copper or aluminum), a heat transfer unit (for example a heat pipe), a light guiding element (for example an optical waveguide or a light conductor connection), an electronic component, or combinations thereof. An inlay can be for instance a metal block, with or without an insulating material coating (IMS-inlay), which could be either embedded or surface mounted for the purpose of facilitating heat dissipation. Suitable materials are defined according to their thermal conductivity, which should be at least 2 W/mK. Such materials are often based, but not limited to metals, metal-oxides and/or ceramics as for instance copper, aluminum oxide ($Al_2O_3$) or aluminum nitride (AlN). In order to increase the heat exchange capacity, other geometries with increased surface area are frequently used as well. Furthermore, a component can be an active electronic component (having at least one p-n-junction implemented), a passive electronic component such as a resistor, an inductance, or capacitor, an electronic chip, a storage device (for instance a DRAM or another data memory), a filter, an integrated circuit (such as field-programmable gate array (FPGA), programmable array logic (PAL), generic array logic (GAL) and complex programmable logic devices (CPLDs)), a signal processing component, a power management component (such as a field-effect transistor (FET), metal-oxide-semiconductor field-effect transistor (MOSFET), complementary metal-oxide-semiconductor (CMOS), junction field-effect transistor (JFET), or insulated-gate field-effect transistor (IGFET), indium phosphide (InP), all based on semiconductor materials such as silicon carbide (SiC), gallium arsenide (GaAs), gallium nitride (GaN), gallium oxide ($Ga_2O_3$), indium gallium arsenide (InGaAs) and/or any other suitable inorganic compound), an optoelectronic interface element, a light emitting diode, a photocoupler, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, an RF chip, and an energy harvesting unit. However, other components may be embedded in the component carrier. For example, a magnetic element can be used as a component. Such a magnetic element may be a permanent magnetic element (such as a ferromagnetic element, an antiferromagnetic element, a multiferroic element or a ferrimagnetic element, for instance a ferrite core) or may be a paramagnetic element. However, the component may also be an IC substrate, an interposer, or a further component carrier, for example in a board-in-board configuration. The component may be surface mounted on the component carrier and/or may be embedded in an interior thereof. Moreover, also other components, in particular those which generate and emit electromagnetic radiation and/or are sensitive with regard to electromagnetic radiation propagating from an environment, may be used as component.

In an embodiment, the component carrier is a laminate-type component carrier. In such an embodiment, the component carrier is a compound of multiple layer structures which are stacked and connected together by applying a pressing force and/or heat.

After processing interior layer structures of the component carrier, it is possible to cover (in particular by lamination) one or both opposing main surfaces of the processed layer structures symmetrically or asymmetrically with one or more further electrically insulating layer structures and/or electrically conductive layer structures. In other words, a build-up may be continued until a desired number of layers is obtained.

After having completed formation of a stack of electrically insulating layer structures and electrically conductive layer structures, it is possible to proceed with a surface treatment of the obtained layers structures or component carrier.

In particular, an electrically insulating solder resist may be applied to one or both opposing main surfaces of the layer stack or component carrier in terms of surface treatment. For instance, it is possible to form such a solder resist on an entire main surface and to subsequently pattern the layer of solder resist so as to expose one or more electrically conductive surface portions which shall be used for electrically coupling the component carrier to an electronic periphery. The surface portions of the component carrier remaining covered with solder resist may be efficiently protected against oxidation or corrosion, in particular surface portions containing copper.

It is also possible to apply a surface finish selectively to exposed electrically conductive surface portions of the component carrier in terms of surface treatment. Such a surface finish may be an electrically conductive cover material on exposed electrically conductive layer structures (such as pads, conductive tracks, etc., in particular comprising or consisting of copper) on a surface of a component carrier. If such exposed electrically conductive layer structures are left unprotected, then the exposed electrically conductive component carrier material (in particular copper) might oxidize, making the component carrier less reliable.

A surface finish may then be formed for instance as an interface between a surface mounted component and the component carrier. The surface finish has the function to protect the exposed electrically conductive layer structures (in particular copper circuitry) and enable a joining process with one or more components, for instance by soldering. Examples for appropriate materials for a surface finish are Organic Solderability Preservative (OSP), Electroless Nickel Immersion Gold (ENIG), Electroless Nickel Immersion Palladium Immersion Gold (ENIPIG), gold (in particular hard gold), chemical tin, nickel-gold, nickel-palladium, etc.

The aspects defined above, and further aspects of the disclosure are apparent from the examples of embodiment to be described hereinafter and are explained with reference to these examples of embodiment.

BRIEF DESCRIPTION OF THE DRAWINGS

FIG. 1 shows a component carrier according to an exemplary embodiment of the disclosure.

FIG. 2A, FIG. 2B, FIG. 2C, FIG. 2D, and FIG. 2E illustrate a method of manufacturing a component carrier according to an exemplary embodiment of the disclosure.

FIG. 3A, FIG. 3B, FIG. 3C, FIG. 3D, FIG. 3E, FIG. 3F, FIG. 3G, FIG. 3H, FIG. 3I, FIG. 3J, and FIG. 3K show a method of manufacturing a component carrier according to another exemplary embodiment of the disclosure.

FIG. 4A, FIG. 4B, FIG. 4C, FIG. 4D, FIG. 4E, FIG. 4F, FIG. 4G, FIG. 4H, FIG. 4I, FIG. 4J, FIG. 4K, FIG. 4L, FIG. 4M, FIG. 4N, and FIG. 4O show a method of manufacturing a component carrier according to another exemplary embodiment of the disclosure.

FIG. 6A, FIG. 6B, FIG. 6C, FIG. 6D, FIG. 6E, FIG. 6F, FIG. 6G, FIG. 6H, FIG. 6I, FIG. 6J, FIG. 6K, FIG. 6L, and FIG. 6M show a method of manufacturing a component carrier according to another exemplary embodiment of the disclosure.

DETAILED DESCRIPTION OF ILLUSTRATED EMBODIMENTS

Figures 5A, 5B, 5C, 5D, 5E, 5F, 5G, 5H, 5I, 5J, 5K:
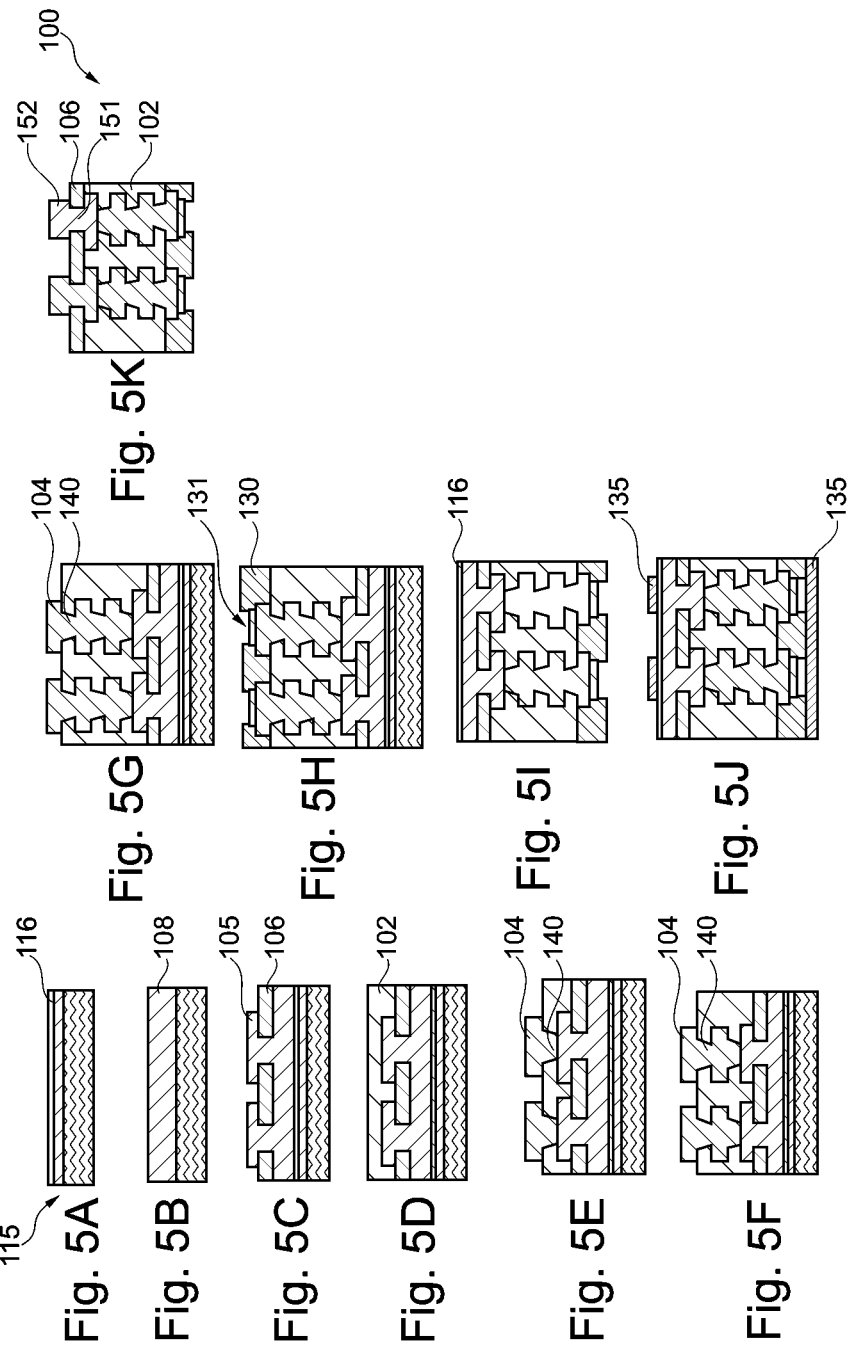
FIG. 5A, FIG. 5B, FIG. 5C, FIG. 5D, FIG. 5E, FIG. 5F, FIG. 5G, FIG. 5H, FIG. 5I, FIG. 5J, and FIG. 5K show a method of manufacturing a component carrier according to another exemplary embodiment of the disclosure.

The illustrations in the drawings are schematically presented. In different drawings, similar or identical elements are provided with the same reference signs.

FIG. 1 shows a component carrier 100 according to an exemplary embodiment of the disclosure. The component carrier 100 is coreless, i.e., there is no additional stabilization structure of core material such as fully cured FR4 or a thick copper layer. The component carrier comprises a stack 110 with a plurality of electrically conductive layer structures 104 stacked one above the other. The electrically conductive layer structures 104 are discontinuous, patterned layers configured as metal traces. The stack 110 further comprises at least one electrically insulating layer structure 102, e.g., prepreg, in which the electrically conductive layer structures 104 are embedded.

The stack 110 further comprises a plurality of vias 140 that vertically interconnect the electrically conductive layer structures 104 in the stack 110. The vias 140 are blind laser-vias, i.e., holes have been drilled in electrically insulating material 102 using a laser and said holes have been filled with an electrically conductive material (e.g., copper).

Since the vias 140 are laser-vias, they are tapering vias, and taper in the same direction, i.e., towards an upper main surface 111 of the stack 110.

The electrically conductive layer structure 104 at the bottom of the stack 110 is embedded in solder resist 130. Holes have been formed through the solder resist 130 to expose the electrically conductive layer structure 104 arranged below. Said holes have been partially filled by a surface finish 132.

A plurality of protruding portions 150 protrude from the outermost electrically conductive layer structure 105 of the stack 110 beyond the upper main surface 111 of the stack 110. The plurality of protruding portions 150 extend in a vertical direction along the z-axis, i.e., parallel to the thickness/height of the component carrier (and perpendicular to the directions of main extension along the x- and y-plane). In comparison to the vias 140, the protruding portions 150 comprise straight sidewalls and do not taper. The vias 140, instead, taper towards the plurality of protruding portions 150.

The stack 110 further comprises a further electrically insulating layer structure 106 that partially embeds the plurality of protruding portions 150. The further electrically insulating layer structure 106 and the electrically insulating layer structure 102 can comprise the same material/properties or be different from each other. A first part of the respective protruding portion 151 is embedded in the stack 110, while a second part of the protruding portion 152 is exposed above the stack 110.

FIGS. 2A to 2E illustrate a method of manufacturing a component carrier according to exemplary embodiments of the disclosure.

As illustrated in FIG. 2A there is provided a preform of a coreless component carrier with a stack 110 of the plurality of electrically conductive layer structures 104, the electrically insulating layer structure(s) 102, the further electrically insulating layer structure 106, and the plurality of vias 140. At the lower main surface, there is arranged an electrically conductive material structure 108 (e.g., copper) above the further electrically insulating layer structure 106. In the further electrically insulating layer structure 106, there are already embedded the first parts of the protruding portions 151.

In FIG. 2B the preform of FIG. 2A has been turned upside down and an etching step (in particular a wet copper etching step) has been applied. Thereby, the electrically conductive material structure 108 has been patterned to obtain the second parts of the protruding portions 152 that are exposed above the stack 110.

In FIG. 2C there is provided a preform of a coreless component carrier with a stack 110 of the plurality of electrically conductive layer structures 104, the electrically insulating layer structure 102, the further electrically insulating layer structure 106, and the plurality of vias 140. At the lower main surface, there is arranged the further electrically insulating layer structure 106. In the further electrically insulating layer structure 106, there are already embedded the first parts of the protruding portions 151.

In FIG. 2D the preform of FIG. 2C is turned upside down and a step of plasma etching (e.g., ABF® etching) is applied. Thereby, material of the further electrically insulating layer structure 106 is removed to provide an exposed part of the protruding portions 152 above the corresponding embedded part of the protruding portions 151.

In FIG. 2E the protruding portions can comprise a variety of different shapes. In this example there is shown a triangular shape, a rectangular shape and a circular (cylindrical) shape.

FIGS. 3A to 3K show a method of manufacturing a component carrier according to another exemplary embodiment of the disclosure.

As illustrated in FIG. 3A there is provided a temporary carrier 115 covered with a metal (copper) layer and a seed layer 116.

In FIG. 3B a further electrically insulating layer structure 106 is formed on the temporary carrier 115 (in particular on the seed layer 116). Holes are formed in the further electrically insulating layer structure 106 (e.g., ABF® or PID), and filled (plated) with electrically conductive material to obtain embedded protruding portions 151. Alternatively, protruding portions 151 can be formed on the temporary carrier 115 which are then embedded in further electrically insulating layer structure material. Additionally, electrically conductive layer structures 104 are formed as a patterned metal layer 105 on the further electrically insulating layer structure 106 and electrically connected to the protruding portions 151.

In FIG. 3C the electrically conductive layer structures 104 are embedded in an electrically insulating layer structure 102 (e.g., GCP).

In FIGS. 3D-3F in further layer build-up steps, electrically insulating layer structures 102, electrically conductive layer structures 104, and vias 140 are formed on top to enlarge the stack 110.

In FIG. 3G a solder resist layer structure 130 is formed on top of the stack 110, so that the outermost electrically conductive layer structure 104 is exposed in the vertical direction of the vias 140.

In FIG. 3H and FIG. 3I the temporary carrier 115 has been removed and the component carrier preform has been turned upside down. The seed layer 116 is still attached to the stack 110 but is then removed to expose the upper surfaces of the embedded protruding portions 151.

In FIG. 3J a surface finish 132 (e.g., Ni/Pd/Au or Ni/Sn) is applied to the upper surfaces of the embedded protruding portions 151 and to the exposed surfaces of the electrically conductive layer structures 104.

In FIG. 3K a step of plasma etching is applied to remove material of the further electrically insulating layer structure 106 to provide an exposed part of the protruding portions 152 above the corresponding embedded part of the protruding portions 151. Thereby, the final component carrier 100 is provided.

FIGS. 4A to 4O show a method of manufacturing a component carrier according to another exemplary embodiment of the disclosure.

In FIG. 4A there is provided a temporary carrier 115 covered with a metal (copper) layer and a seed layer 116.

In FIG. 4B electrically conductive material structures 108, which comprise two metal layers 108, 109, respectively, are formed on the temporary carrier 115.

In FIG. 4C these structures are then embedded in electrically insulating layer structure material 102. Additionally, an electrically conductive layer structure 104 (this will be later-on the outermost electrically conductive layer structure 105) are formed as patterned metal layers 105 on the further electrically insulating layer structure 102 and are electrically connected to the electrically conductive material structures 108.

In FIGS. 4D-4G in further layer build-up steps, electrically insulating layer structures 102, electrically conductive layer structures 104, and vias 140 are formed on top to enlarge the stack 110.

In FIG. 4H a solder resist layer structure 130 is formed on top of the stack 110, so that the outermost electrically conductive layer structure 104 is exposed in the vertical direction of the vias 140.

In FIG. 4I a surface finish 132 is applied to the upper (exposed) surfaces of the outermost electrically conductive layer structure 104.

In FIG. 4J the temporary carrier 115 is removed and the component carrier preform is turned upside down. The seed layer 116 is still attached to the stack 110.

In FIG. 4K an insulated film 135 is formed on the upper and on the lower main surface of the stack 110. Hereby, the seed layer 116 above the electrically conductive material structures 108 in vertical direction is exposed.

In FIG. 4L the seed layer 116 is removed to expose the electrically conductive material structures 108.

In FIG. 4M the holes in the dielectric film 135 are filled with solder to obtain solder bumps 155 (e.g., Ni/Sn plating).

In FIG. 4N the insulated film 135 is removed from the upper and lower main surface of the stack 110.

In FIG. 4O the seed layer 116 is removed and the component carrier 100 is provided. The solder bumps 155, connected to the electrically conductive material structures 108, form protruding portions 150.

FIGS. 5A to 5K show a method of manufacturing a component carrier according to another exemplary embodiment of the disclosure.

In FIG. 5A there is provided a temporary carrier 115 covered with a metal (copper) layer and a seed layer 116.

In FIG. 5B an electrically conductive material structure 108 is arranged (plated) on the seed layer 116 as a continuous layer.

In FIG. 5C the electrically conductive material structure 108 is then covered by further electrically insulating layer structure material 106. Additionally, an electrically conductive layer structure 104 (this will be later-on the outermost electrically conductive layer structure 105) is formed as a patterned metal layer 105 on the further electrically insulating layer structure 106 and is electrically connected to the electrically conductive material structures 108.

In FIG. 5D the patterned metal layer 105 is embedded in electrically insulating layer structure material 102.

As illustrated in FIGS. 5E-5G in further layer build-up steps, electrically insulating layer structures 102, electrically conductive layer structures 104, and vias 140 are formed on top to enlarge the stack 110.

In FIG. 5H there is arranged a solder resist layer structure 130 on top of the stack 110, so that the outermost electrically conductive layer structure 104 is exposed in the vertical direction of the vias 140. The exposed electrically conductive layer structure 104 is covered by a surface finish 132.

In FIG. 5I the temporary carrier 115 is removed and the component carrier preform is turned upside down. The seed layer 116 is still attached to the stack 110.

In FIG. 5J film structures 135 (photoresist) are arranged on the seed layer 116 at positions that are an elongation of the vertical direction of the vias 140. Further, the lower main surface (solder resist 130) of the stack 110 is covered by a film layer 135.

In FIG. 5K the film structures 135 are used to protect the copper regions below. Copper material of the electrically conductive material structure 108 is removed (by etching), so that the film protected regions below remain as protruding portions 150. The component carrier 100 comprises a first protruding portion part 151 embedded in the further electrically insulating layer structure 106 and a second protruding portion part 151 that is exposed.

FIGS. 6A to 6M show a method of manufacturing a component carrier according to another exemplary embodiment of the disclosure.

In FIG. 6A there is provided a temporary carrier 115 covered with a metal (copper) layer and a seed layer 116.

In FIG. 6B an electrically conductive material structure 108 is arranged (plated) on the seed layer 116 as a patterned (discontinuous) layer.

In FIG. 6C the electrically conductive material structure 108 is enlarged by a portion with a lower width. Then, the electrically conductive material structure 108 and the portion are embedded in electrically insulating layer structure material 102. An electrically conductive layer structure 104 (which will become the outermost electrically conductive layer structure 105) is formed on the electrically insulating layer structure material 102 and top of (and electrically connected to) the portion with lower width. The electrically conductive layer structure 105 is configured as a patterned layer, wherein the portions of the patterned layer comprise a width that is larger than the width of the portion with lower width and the electrically conductive material structure 108 portions.

As shown in FIGS. 6D-6G in further layer build-up steps, electrically insulating layer structures 102, electrically conductive layer structures 104, and vias 140 are formed on top to enlarge the stack 110.

In FIG. 6H there is arranged a solder resist layer structure 130 on top of the stack 110, so that the outermost electrically conductive layer structure 104 is exposed in the vertical direction of the vias 140.

In FIG. 6I the exposed electrically conductive layer structure 104 is covered by a surface finish 132.

In FIG. 6J the temporary carrier 115 is removed and the component carrier preform is turned upside down. The seed layer 116 is still attached to the stack 110.

In FIG. 6K the seed layer 116 is removed.

In FIG. 6L protection caps 133 are arranged on exposed upper surfaces of the electrically conductive material structure 108.

In FIG. 6M the protection caps 133 are used to protect the copper regions below. A part of the further electrically insulating layer structure 106 is removed (by plasma etching), so that the cap 133 protected regions below remain as protruding portions 150. The component carrier 100 comprises a first protruding portion part 151 embedded in the further electrically insulating layer structure 106 and a second protruding portion part 152 that is exposed.

It should be noted that the term "comprising" does not exclude other elements or steps and the article "a" or "an" does not exclude a plurality. Also, elements described in association with different embodiments may be combined.

Implementation of the disclosure is not limited to the preferred embodiments shown in the figures and described above. Instead, a multiplicity of variants is possible which variants use the solutions shown and the principle according to the disclosure even in the case of fundamentally different embodiments.

The invention claimed is:

1. A component carrier, being a coreless component carrier, comprising:
   a stack with at least two electrically conductive layer structures and at least one electrically insulating layer structure;
   a plurality of vias that vertically interconnect the electrically conductive layer structures in the stack,
   wherein the vias comprise an electrically conductive material,
   wherein the vias are tapering vias,
   wherein the vias taper in the same direction;
   a plurality of protruding portions that protrude from the outermost electrically conductive layer structure of the stack beyond the upper main surface of the stack; and
   an electrically conductive cover material exclusively covering an upper main surface of at least one of the plurality of protruding portions protruding from and beyond the outermost electrically conductive layer structure of the stack.

2. The component carrier according to claim 1, wherein the plurality of protruding portions extends in a vertical direction (z) with respect to the stack.

3. The component carrier according to claim 1, wherein at least one protruding portion from the plurality of protruding portions comprises at least one of straight sidewalls or does not taper.

4. The component carrier according to claim 1, wherein at least one protruding portion from the plurality of protruding portions comprises one cross-sectional shape of the group which consists of: circular, rectangular, polygonal, triangular, conical, frustoconical.

5. The component carrier according to claim 1, wherein the plurality of vias tapers towards the plurality of protruding portions.

6. The component carrier according to claim 1, wherein at least one of the electrically conductive layer structures comprises a vertically extending portion with straight sidewalls, wherein the vertically extending portion is at least partially embedded in the stack.

7. The component carrier according to claim 1, wherein at least one of the electrically conductive layer structures is configured as a discontinuous layer.

8. The component carrier according to claim 1, wherein at least one protruding portion from the protruding portions comprises metal bumps.

9. The component carrier according to claim 1, wherein the plurality of electrically conductive layer structures is embedded in the at least one electrically insulating layer structure.

10. The component carrier according to claim 1, wherein the at least one electrically insulating layer structure partially embeds the plurality of protruding portions.

11. The component carrier according to claim 1, further comprising:
   a further electrically insulating layer structure that partially embeds the plurality of protruding portions.

12. A method of manufacturing a coreless component carrier, the method comprising:
   forming a stack with at least two electrically conductive layer structures and at least one electrically insulating layer structure;
   forming a plurality of vias that vertically interconnect the electrically conductive layer structures in the stack, and filling the plurality of vias with an electrically conductive material, such that the vias are tapering vias, and taper in the same direction;
   forming a plurality of protruding portions that protrude from the outermost electrically conductive layer structure of the stack beyond the upper main surface of the stack; and forming an electrically conductive cover material exclusively covering an upper main surface of at least one of the plurality of protruding portions protruding from and beyond the outermost electrically conductive layer structure of the stack.

13. The method according to claim 12, wherein forming the plurality of protruding portions comprises:

at least partially exposing the plurality of protruding portions.

14. The method according to claim 13, wherein exposing comprises:

removing electrically insulating material of at least one of the at least one electrically insulating layer structure or the further electrically insulating layer structure.

15. The method according to claim 14, wherein removing comprises:

at least partially removing the electrically insulating material by plasma etching.

16. The method according to claim 14, wherein the electrically insulating material comprises a film.

17. The method according to claim 13, wherein exposing comprises:

removing electrically conductive material of the outermost electrically conductive layer structure.

18. The method according to claim 17, wherein removing comprises:

at least partially removing the electrically conductive material by wet etching.

19. The method according to claim 12, wherein forming the plurality of protruding portions comprises:

forming a hole in an electrically insulating material structure; and filling the hole with electrically conductive material.

20. The method according to claim 12, further comprising at least one of the following features:

wherein forming the plurality of protruding portions comprises:

forming a metal bump on the outermost electrically conductive layer structure;

wherein forming the plurality of protruding portions is free of grinding;

wherein forming the plurality of vias comprises:

forming tapering holes by laser drilling;

wherein the plurality of protruding portions is formed before the plurality of vias;

at least partially forming the stack on a temporary carrier, and removing the temporary carrier before forming the plurality of protruding portions;

wherein forming the stack comprises lamination.

21. A method of manufacturing a coreless component carrier, the method comprising:

forming a stack with at least two electrically conductive layer structures and at least one electrically insulating layer structure;

forming a plurality of vias that vertically interconnect the electrically conductive layer structures in the stack, and filling the plurality of vias with an electrically conductive material, so that the vias are tapering vias, and taper in the same direction; and forming a plurality of protruding portions that protrude from the outermost electrically conductive layer structure of the stack beyond the upper main surface of the stack by at least partially exposing;

the method further comprising at least one of the following features:

wherein exposing comprises removing electrically conductive material of the outermost electrically conductive layer structure;

wherein exposing comprises at least partially removing the electrically conductive material by wet etching.

* * * * *